(12) United States Patent
Saito

(10) Patent No.: US 8,025,950 B2
(45) Date of Patent: Sep. 27, 2011

(54) SENSOR-SECURING APPARATUS AND CAMERA MODULE

(75) Inventor: Tetsuo Saito, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 12/615,471

(22) Filed: Nov. 10, 2009

(65) Prior Publication Data

US 2010/0151192 A1 Jun. 17, 2010

(30) Foreign Application Priority Data

Dec. 17, 2008 (JP) ................. 2008-321378

(51) Int. Cl.
*B32B 3/10* (2006.01)
*H04N 1/028* (2006.01)
*H01L 27/146* (2006.01)

(52) U.S. Cl. ........ 428/137; 250/239; 257/432; 257/433; 257/434; 257/711; 257/712; 361/688; 361/704; 361/707; 361/708; 361/711; 361/807; 361/808; 348/294; 348/373; 348/374; 428/119; 428/120; 428/131; 428/132; 428/133; 428/134; 428/138; 428/139; 428/156; 428/172

(58) Field of Classification Search ............ 257/E31.131
See application file for complete search history.

(56) References Cited

U.S. PATENT DOCUMENTS

| 6,654,064 | B2 * | 11/2003 | Ishikawa ................. 348/374 |
| 6,693,674 | B1 * | 2/2004 | Wataya et al. ............. 348/373 |
| 6,759,638 | B2 | 7/2004 | Han et al. |
| 6,956,615 | B2 * | 10/2005 | Nakagishi et al. .......... 348/374 |
| 7,436,443 | B2 * | 10/2008 | Hirunuma et al. ........... 348/294 |
| 7,663,694 | B2 * | 2/2010 | Kurosawa .................. 348/374 |
| 7,719,585 | B2 * | 5/2010 | Shimizu et al. ............. 348/294 |
| 7,821,554 | B2 * | 10/2010 | Ma et al. .................... 348/294 |
| 7,829,833 | B2 * | 11/2010 | Kobayashi et al. ......... 250/208.1 |
| 2005/0258502 | A1 | 11/2005 | Kong et al. |
| 2009/0303360 | A1 * | 12/2009 | Huang ....................... 348/294 |

FOREIGN PATENT DOCUMENTS

| JP | 2001-285722 | | 10/2001 |
| JP | 2004-080039 | | 3/2004 |
| JP | 2004-221248 | | 8/2004 |
| JP | 2004-221248 A | * | 8/2004 |
| JP | 2005-217024 A | * | 10/2005 |

(Continued)

OTHER PUBLICATIONS

English Abstract of JP 2004-221248 A, Aug. 2004.*

(Continued)

*Primary Examiner* — Alicia Chevalier
*Assistant Examiner* — Jeff A Vonch
(74) *Attorney, Agent, or Firm* — Blakely, Sokoloff, Taylor & Zafman LLP

(57) ABSTRACT

According to one embodiment, a sensor-securing apparatus has a frame having a sensor-mount region to hold an image sensor that generates heat while operating. The frame has a first adhesive-applying hole and a plurality of second adhesive-applying holes. The first adhesive-applying hole opens in the sensor-mount region and faces the center part of the image sensor. The second adhesive-applying holes are smaller than the first adhesive-applying hole, open in the sensor-mount region and are arranged around the first adhesive-applying hole. Adhesive is filled in the first adhesive-applying hole and the second adhesive-applying holes. The adhesive secures the image sensor to the frame.

10 Claims, 4 Drawing Sheets

FOREIGN PATENT DOCUMENTS

| | | |
|---|---|---|
| JP | 2005-333142 | 12/2005 |
| JP | 2007-155800 | 6/2007 |
| JP | 2007-227673 | 9/2007 |
| JP | 2007-324244 | 12/2007 |

OTHER PUBLICATIONS

English Abstract of JP 2005-217024 A, Oct. 2005.*
English translation of Japanese Notice of Reasons for Rejection dated Jan. 12, 2010.

* cited by examiner

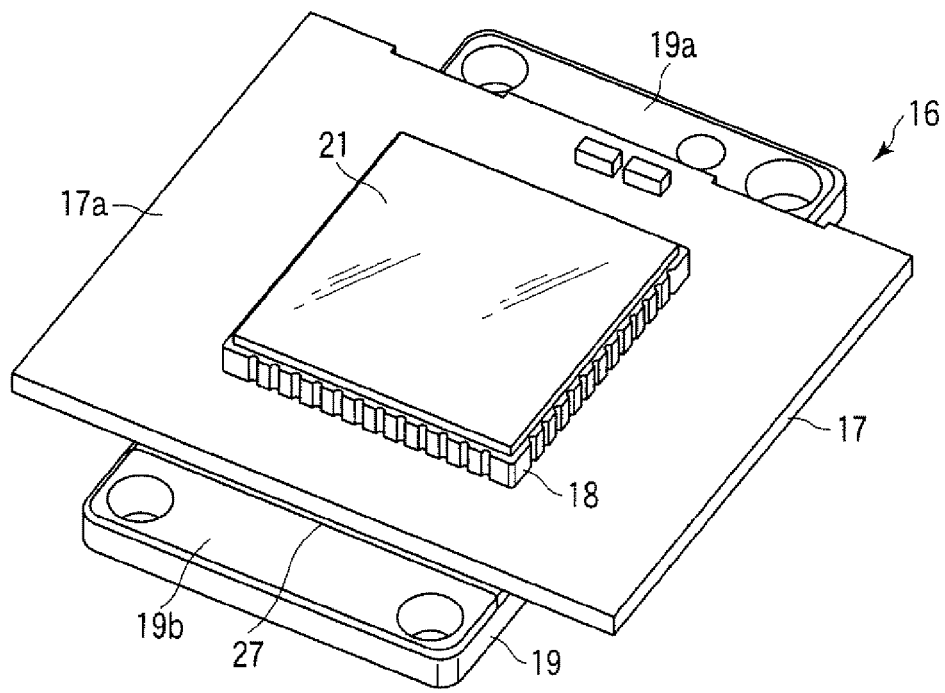
F I G. 5
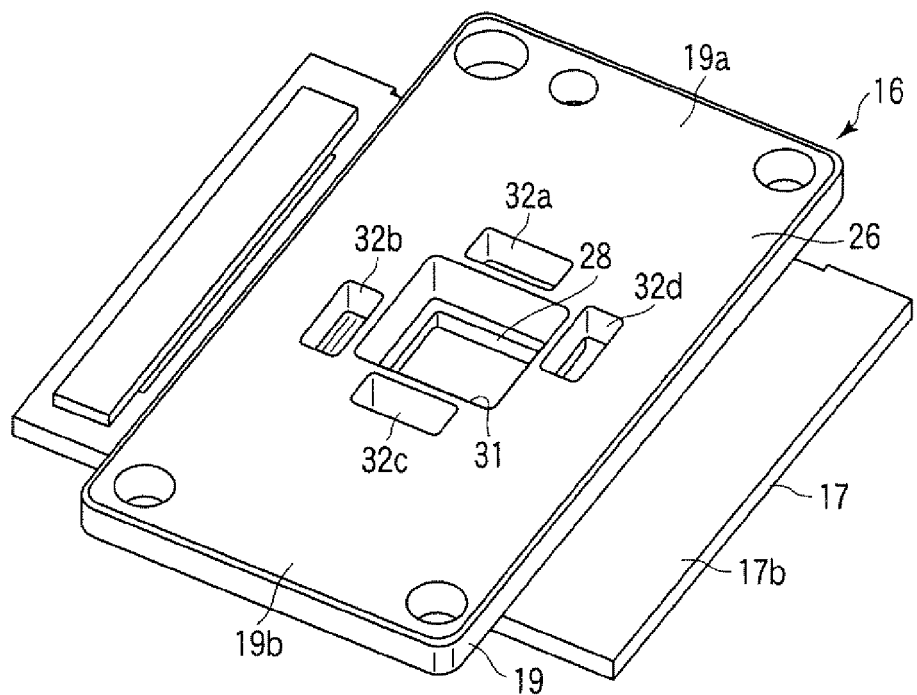
F I G. 6

SENSOR-SECURING APPARATUS AND CAMERA MODULE

CROSS-REFERENCE TO RELATED APPLICATIONS

This application is based upon and claims the benefit of priority from Japanese Patent Application No. 2008-321378, filed Dec. 17, 2008, the entire contents of which are incorporated herein by reference.

BACKGROUND

1. Field

One embodiment of the invention relates to a sensor-securing apparatus designed to secure an image sensor, such as a CMOS sensor, to a frame by use of an adhesive. The invention also relates to a camera module having a frame that holds an image sensor, more particularly to a structure for securing the image sensor to the frame.

2. Description of the Related Art

Business-use color camera modules designed to process image data at high speed comprise a holder, a base and a CMOS image sensor as is disclosed in, for example, Jpn. Pat. Appln, KOKAI Publication No. 2007-155800. The holder holding a lens unit is secured to the base. The CMOS image sensor is adhered to the center part of a substrate. The substrate is adhered, at its outer circumferential edge, to the bottom of the base. Since the substrate is so adhered, the center of the CMOS image sensor is aligned with the optical axis of the lens unit, and the CMOS image sensor is held at a prescribed distance from the lens unit.

In the conventional color camera module that is disclosed in the above-identified publication, the circumferential edge of the substrate holding the CMOS image sensor is adhered to the bottom of the base. Therefore, the area in which the substrate is adhered to the base is not large enough to secure the image sensor to the base. The substrate will therefore inevitably move if the color camera module receives a large external impact. Consequently, the center of the CMOS image sensor will deviate from the optical axis of the lens unit, possibly rendering it necessary to adjust the optical axis minutely in position.

The CMOS image sensor generates heat while operating. The heat must be radiated outside as much as possible, in order to suppress the temperature rise of the CMOS image sensor.

Here arises a problem. In the conventional color camera module, the CMOS sensor is merely adhered to the substrate and no components are provided to promote the heat radiation from the CMOS sensor. To make matters worse, the heat the CMOS image sensor generates tends to accumulate in the space between the substrate and the base. The heat-radiating efficiency of the CMOS image sensor is therefore inevitably low.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 5 is an exemplary perspective view of the embodiment, showing the substrate holding the CMOS image sensor and secured to the frame;

FIG. 6 is an exemplary perspective view of the embodiment, illustrating the positional relation between the frame and the substrate, the frame having first and second adhesive-applying holes;

DETAILED DESCRIPTION

Various embodiments according to the invention will be described hereinafter with reference to the accompanying drawings. In general, according to one embodiment of the invention, a sensor-securing apparatus has a frame with a sensor-mount region for holding an image sensor that generates heat while operating. The frame has a first adhesive-applying hole and second adhesive-applying holes. The first adhesive-applying hole opens in the sensor-mount region and is opposed to the center part of the image sensor. The second adhesive-applying holes are smaller than the first adhesive-applying hole. They open in the sensor-mount region, too, and are arranged around the first adhesive-applying hole. The first adhesive-applying hole and the second adhesive-applying holes are filled with adhesive. The adhesive secures the image sensor to the frame.

This embodiment of the invention will be described with reference to FIG. 1 to FIG. 8.

Figure 1:
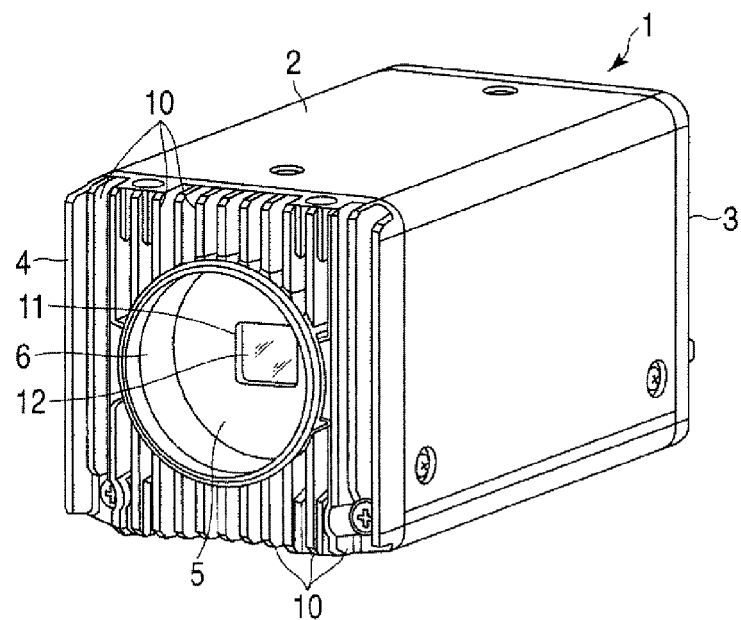
FIG. 1 is a perspective view of an exemplary color camera module according to an embodiment of the invention.

FIG. 1 shows a color camera module 1 for use in industrial apparatuses and business-use image processing apparatuses. The camera module 1 comprises a top cover 2, a rear cover 3, and a front cover 4. The top cover 2 is shaped like a sheet metal processing. The rear cover 3 is fixed to the top cover 2, covering the rear opening of the top cover 2.

The front cover 4 is made of a metal such as aluminum alloy and has sufficient rigidity and thermal conductivity. The front cover 4 comprises a square front wall 5 and a lens mount 6. The front wall 5 is fastened to the top cover 2, closing the front opening of the top cover 2.

Figure 2:
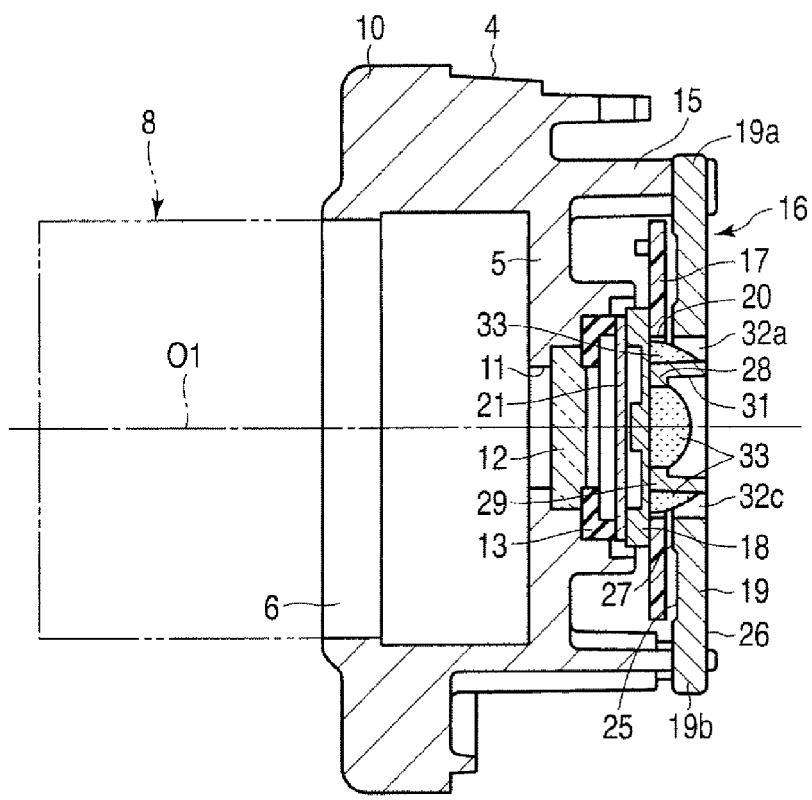
FIG. 2 is an exemplary sectional view of the embodiment, showing the sensor module fixed to the front cover of the color camera module.
Figure 3:
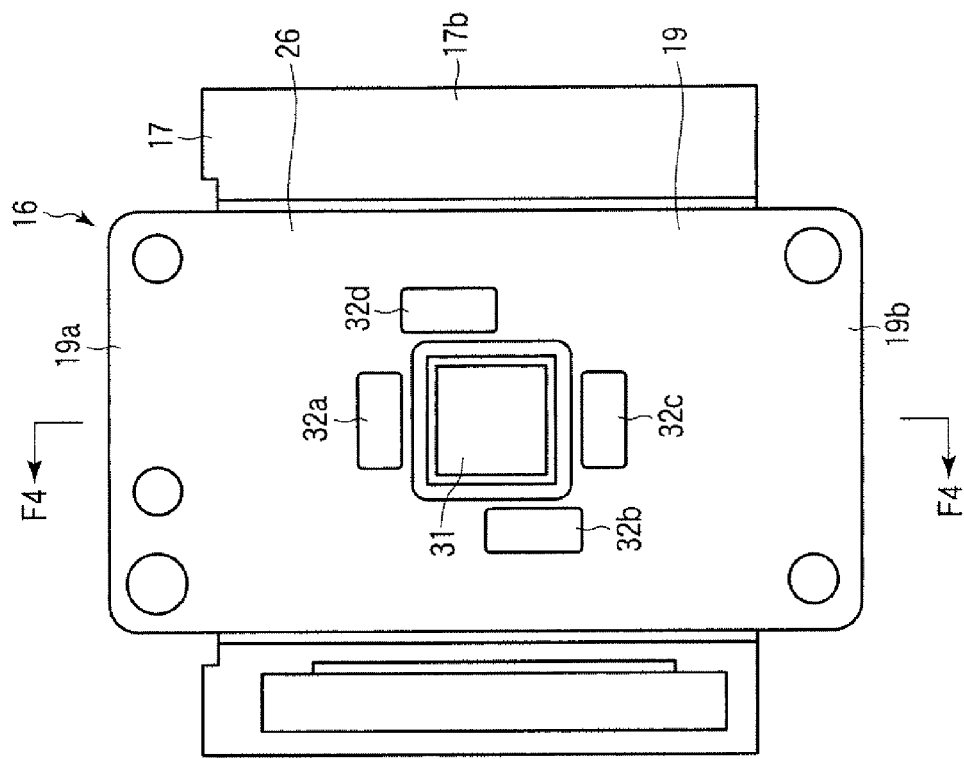
FIG. 3 is an exemplary plan view of the embodiment, illustrating the positional relation to the substrate and the frame.

As shown in FIG. 2, the lens mount 6 is designed to hold a hollow cylindrical lens 8 that has an optical axis O1. The lens mount 6 is shaped like a hollow cylinder, extending forwards from the front wall 5. A plurality of heat-radiating fins 10 are formed integrally with the outer surface of the front wall 5. The fins 10 are arranged around the lens mount 6 and spaced apart from one another.

The front wall 5 has a square light-guiding hole 11, in the part that is surrounded by the lens mount 6. The light-guiding hole 11 is covered with a filter glass plate 12, at the back of the front wall 5. The filter glass plate 12 is secured to the front wall 5 by a filter packing 13.

A sensor-supporting part 15 is formed integrally with the front wall 5 of the front cover 4. The sensor-supporting part 15 is shaped like an oval cylinder, extends away from the lens mount 6, arranged coaxial with the filter glass plate 12, and surrounds the filter glass plate 12.

A sensor module 16 is attached to the sensor-supporting part 15. As shown in FIG. 2 to FIG. 6, the sensor module 16 comprises a substrate 17, a CMOS image sensor 18, and a frame 19.

Figure 7:
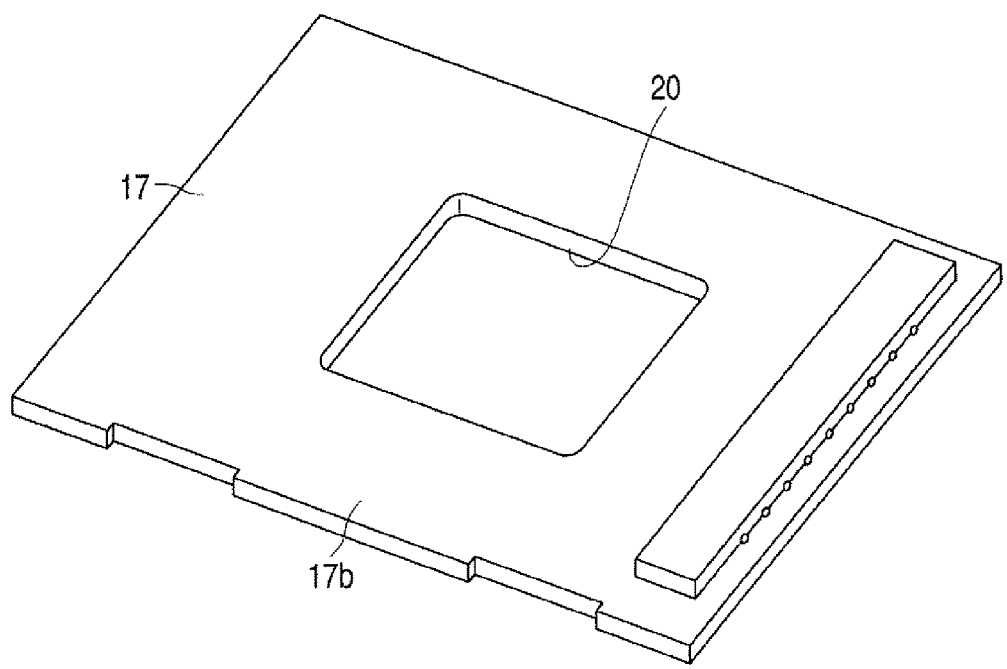
FIG. 7 is an exemplary perspective view of the substrate of the embodiment.

The substrate 17 is rectangular, and is small enough to lie within the sensor-supporting part 15. As seen from FIG. 4, the substrate 17 has a first surface 17a and a second surface 17b, which is opposed to the first surface 17a. The substrate 17 has a square through hole 20, which is made in the center part as shown in FIG. 7. The through hole 20 extends in the direction of thickness of the substrate 17 and opens at both the first surface 17a and the second surface 17b.

As shown in FIG. 5, the CMOS image sensor 18 is constituted by a square semiconductor package. The CMOS image sensor 18 has a plurality of outer leads (not shown) arranged at the four edges. The outer leads are soldered to the first surface 17a of the substrate 17. The CMOS image sensor 18 is thereby secured to the first surface 17a of the substrate 17.

Once the CMOS image sensor 18 has been soldered to the substrate 17, the through hole 20 of the substrate 17 is aligned with the center part of the image sensor 18. That surface of the CMOS image sensor 18, which faces away from the substrate 17, is covered with a protective glass plate 21. The protective glass plate 21 is adhered with adhesive 22 to the CMOS image sensor 18.

The CMOS image sensor 18 generates heat while operating. The higher the operating speed, the greater the amount of the heat it will generate. To maintain the CMOS image sensor 18 in an appropriate operating environment, it is critical to promote the heat radiation from the CMOS image sensor 18.

The frame 19 is made of a metal such as an aluminum alloy, and has sufficient rigidity and thermal conductivity. The frame 19 is a rectangular plate having a first end 19a and a second end 19b. The first and second ends 19a and 19b are spaced apart in the longitudinal direction of the frame 19.

Figure 4:
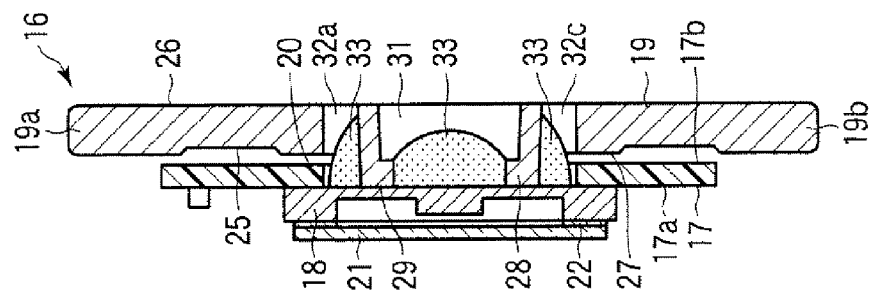
FIG. 4 is an exemplary sectional view taken along line F4-F4 shown in FIG. 3.
Figure 8:
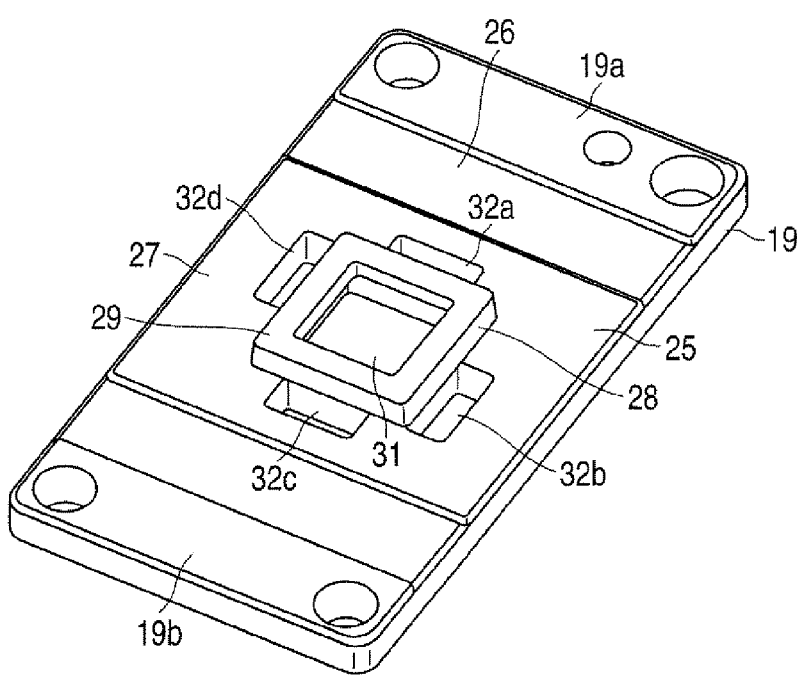
FIG. 8 is an exemplary perspective view of the frame used in the embodiment of the invention.

As shown in FIG. 4, FIG. 6 and FIG. 8, the frame 19 has a mount surface 25, a heat-radiating surface 26, and a sensor-mount region 27. The heat-radiating surface 26 faces away from the mount surface 25. The sensor-mount region 27 is a part of the mount surface 25 and is located between the first end 19a and second end 19b of the frame 19.

A projection 28 shaped like a square frame is formed integrally with the frame 19 and provided in the sensor-mount region 27 thereof. The distal end of the projection 28 is flat, serving as heat-receiving surface 29. The heat-receiving surface 29 protrudes from the mount surface 25 of the frame 19. The heat-receiving surface 29 is parallel to the mount surface 25 and located at the center part of the sensor-mount region 27.

The frame 19 has a first adhesive-applying hole 31 and second adhesive-applying holes 32a, 32b, 32c and 32d. The first adhesive-applying hole 31 is positioned at the center of the frame 19. The first adhesive-applying hole 31 has a square opening that extends in the direction of thickness of the frame 19. The first adhesive-applying hole 31 opens, at one end, to the heat-receiving surface 29. At the other end, the first adhesive-applying hole 31 opens to the heat-radiating surface 26.

The second adhesive-applying holes 32a, 32b, 32c and 32d are arranged around the projection 28 and first adhesive-applying hole 31. More precisely, these holes 32a, 32b, 32c and 32d are elongated and extend through the frame 19 in the thickness direction thereof. The second adhesive-applying holes 32a, 32b, 32c and 32d are smaller than the first adhesive-applying hole 31.

Around the first adhesive-applying hole 31, the second adhesive-applying holes 32a, 32b, 32c and 32d are spaced from one another at specific intervals. The second adhesive-applying holes 32a, 32b, 32c and 32d open, at one end, to the amount surface 25. At the other end, the holes 32a, 32b, 32c and 32d open to the heat-radiating surface 26.

As shown in FIG. 4, the substrate 17, to which the CMOS image sensor 18 is soldered, is fastened to the sensor-mount region 27 of the frame 19, with thermally conductive adhesive 33. The substrate 17 is fixed to the frame 19 by a jig (not shown) and positioned with its second surface 17b facing the sensor-mount region 27.

At the time the substrate 17 and the frame 19 are completely positioned relative to each other, the projection 28 of the frame 19 enters the through hole 20 of the substrate 17, whereby the heat-receiving surface 29 of the projection 28 comes into direct contact with the CMOS image sensor 18. As a result, the first adhesive-applying hole 31 opening to the heat-receiving surface 29 opposes the center part of the CMOS image sensor 18. In addition, the second adhesive-applying holes 32a, 32b, 32c and 32d communicate with the through hole 20, around the projection 28, and face the CMOS image sensor 18 via the trough hole 20.

After the substrate 17 and the frame 19 have been aligned in position, the adhesive 33 is applied from the heat-radiating surface 26 into the first adhesive-applying hole 31 and the second adhesive-applying holes 32a, 32b, 32c and 32d.

As shown in FIG. 4, the adhesive 33 applied into the first adhesive-applying hole 31 is cured in the area of the hole 31 with the surface of the CMOS image sensor 18. Similarly, the adhesive 33 applied into the second adhesive-applying holes 32a, 32b, 32c and 32d are cured same way of the hole 31. Once the adhesive 33 has been cured, the CMOS image sensor 18 is secured on the sensor-mount region 27 of the frame 19. The adhesive 33 is exposed outside the sensor module 16 at that end of the first adhesive-applying hole 31 which opens to the heat-radiating surface 26, and at those ends of the second adhesive-applying holes 32a, 32b, 32c and 32d, which open to the heat-radiating surface 26.

As shown in FIG. 3 to FIG. 6, the first end 19a and second end 19b of the frame 19 protrude from the edges of the substrate 17 once the substrate 17 holding the CMOS image sensor 18 has been secured to the frame 19. The first end 19a and second end 19b of the frame 19 are fastened to the distal surface of the sensor-supporting part 15 of the front cover 4, with a plurality of screws (not shown).

Now that the first end 19a and second end 19b are fastened to the sensor-supporting part 15, the substrate 17 is interposed between the frame 19 and the front wall 5 of the front cover 4 and the center of the CMOS image sensor 18 is aligned with high precision with the optical axis O1 of the lens 8. Moreover, the protective glass plate 21 that covers the CMOS image sensor 18 faces the filter glass plate 12 of the front cover 4, with the filter packing 13 clamped between it and the filter glass plate 12.

In the camera module 1 configured as described above, the frame 19 to which the CMOS image sensor 18 is secured has a first adhesive-applying hole 31 and second adhesive-applying holes 32a, 32b, 32c and 32d. The second adhesive-applying holes 32a, 32b, 32c and 32d are smaller than the first adhesive-applying hole 31 and arranged around the first adhesive-applying hole 31. The adhesive 33 applied into the first adhesive-applying hole 31 and second adhesive-applying holes 32a, 32b, 32c and 32d secures the CMOS image sensor 18 to the sensor-mount region 27 of the frame 19.

Thus, the CMOS image sensor 18 is adhered to the frame 19 at five parts, i.e., the center part and four parts around the center part. This increases the area in which the adhesive 33 contacts the CMOS image sensor 18. The CMOS image sensor 18 is therefore adhered to the frame 19 more firmly than otherwise. Hence, the camera module 1 can have such an impact-resistance required of industrial or business-use color camera modules. Therefore, problems are not caused as regards dislocation of the CMOS image sensor 18 from the optical axis O1 of the lens 8.

Moreover, in the camera module 1, the heat-receiving surface 29 of the projection 28 lies in the through hole 20 of the substrate 17 and directly contacts the center part of the CMOS image sensor 18. The heat that the CMOS image sensor 18 generates can, therefore, be conducted at high efficiency to the frame 19 from the heat-receiving surface 29.

The heat is readily conducted from the CMOS image sensor 18 to the frame 19, particularly because the frame 19 is made of metal and therefore excels in thermal conductivity. Further, the heat conducted to the frame 19 efficiently diffuses to the front cover 4, because the frame 19 made of metal is fastened to the front cover 4, which is made of metal, too.

The frame 19 and the front cover 4 can therefore be positively used as efficient heat sinks. This helps to promote the radiation of heat from the CMOS image sensor 18.

Furthermore, the second adhesive-applying holes 32a, 32b, 32c and 32d are smaller than the first adhesive-applying hole 31 and arranged around the first adhesive-applying hole 31. The sensor-mount region 27 of the frame 19 can therefore act as a heat conduction path, though a plurality of holes opened in the sensor-mount region 27. Through this heat conduction path, the heat can be readily conducted from the CMOS image sensor 18 to the frame 19. This also promotes the radiation of heat from the CMOS image sensor 18.

In addition, the adhesive 33 has been applied into the first adhesive-applying hole 31 and second adhesive-applying holes 32a, 32b, 32c and 32d from the heat-radiating surface 26 of the frame 19, which face away from the CMOS image sensor 18. Therefore, neither the CMOS image sensor 18 nor the substrate 17 hinders the flow of the adhesive 33. This facilitates the application of the adhesive 33.

In addition, the adhesive 33 can be seen from outside the sensor module 16, through that end of the first adhesive-applying hole 31 which opens in the heat-radiating surface 26, and through those ends of the second adhesive-applying holes 32a, 32b, 32c and 32d, which open in the heat-radiating surface 26. This makes it easy to observe how the adhesive 33 is being applied and recognize how the adhesive 33 has been cured.

Hence, the CMOS image sensor 18 can be secured to the frame 19 at an increased efficiency. Ultimately, the sensor module 16 can be assembled both efficiently and reliably.

The invention is not limited to the embodiment described above. Various changes and modifications can be made, without departing from the scope and spirit of the present invention.

For example, the number of second adhesive-applying holes is not limited to four. Further, the second adhesive-applying holes are not limited to rectangular ones. They may be, for example, circular holes or elongate arced holes.

Further, the image sensor is not limited to a CMOS image sensor. It may be any other imaging element, such as a CCD image sensor.

While certain embodiments of the inventions have been described, here embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A sensor-securing apparatus comprising:
   a metal frame having a sensor-mount region; and
   an image sensor that is fixed to the sensor-mount region and generates heat in an operation, wherein the frame includes:
      a mount surface in which the sensor-mount region is defined;
      a projection protruding from the mount surface;
      a heat-receiving surface that is formed at the distal end of the projection and contacts with the image sensor;
      a first adhesive-applying hole opening in the heat-receiving surface and facing a center part of the image sensor; and
      a plurality of second adhesive-applying holes opening in the mount surface around the projection, the second adhesive-applying holes smaller than the first adhesive-applying hole and distant from the first adhesive-applying hole; and
      thermally conductive adhesive is filled in each of the first adhesive-applying hole and the second adhesive-applying holes, to secure the image sensor to the frame.

2. The sensor-securing apparatus of claim 1, wherein the second adhesive-applying holes are spaced from one another in a circumferential direction of the first adhesive-applying hole so as to surround the projection and the first adhesive-applying hole.

3. The sensor-securing apparatus of claim 2 wherein the frame has a heat-radiating surface positioned at an opposite side of the sensor-mount region, the first adhesive-applying hole and second adhesive-applying holes open in the heat-radiating surface, and the thermally conductive adhesive is exposed in a direction of the heat-radiating surface from the first adhesive-applying hole and second adhesive-applying holes.

4. A sensor-securing apparatus comprising:
   an image sensor that generates heat;
   a substrate configured to support the image sensor, and having a through hole to be aligned with a center part of the image sensor; and
   a metal frame arranged in an opposite side of the image sensor with respect to the substrate, the metal frame having a mount surface to which the image sensor is fixed;
   wherein the frame includes:
      a projection protruding from the mount surface so as to enter inside the through hole of the substrate;
      a heat-receiving surface that is formed at the distal end of the projection and contacts with the center part of the image sensor;
      a first adhesive-applying hole opening in the heat-receiving surface; and
      a plurality of second adhesive-applying holes opening in the mount surface around the projection so as to surround the first adhesive-applying hole, the second adhesive-applying holes smaller than the first adhesive-applying hole and distant from the first adhesive-applying hole; and
      thermally conductive adhesive is filled in each of the first adhesive-applying hole and the second adhesive-applying holes, to secure the image sensor to the frame.

5. The sensor-securing apparatus of claim 4, wherein the second adhesive-applying holes are spaced from one another in a circumferential direction of the first adhesive-applying hole.

6. The sensor-securing apparatus of claim 4, wherein the second adhesive-applying holes are arranged to oppose the image sensor via the through hole of the substrate.

7. The sensor-securing apparatus of claim 6, wherein frame has a heat-radiating surface facing away from the heat-receiving surface, the first adhesive-applying hole and second adhesive-applying holes open in the heat-radiating surface, and the thermally conductive adhesive is exposed in a direction of the heat-radiating surface from the first adhesive-applying hole and second adhesive-applying holes.

8. A camera module comprising:

a front cover having a lens mount;

a metal frame that is fixed to the front cover and has a sensor-mount region; and an image sensor that is fixed to the sensor-mount region and generates heat in an operation, wherein the frame includes a mount surface in which the sensor-mount region is defined;

a projection protruding from the mount surface;

a heat-receiving surface that is formed at the distal end of the projection and contacts with the image sensor;

a first adhesive-applying hole opening in the heat-receiving surface and facing a center part of the image sensor; and a plurality of second adhesive-applying holes opening in the mount surface around the projection, the second adhesive-applying holes smaller than the first adhesive-applying hole and distant from the first adhesive-applying hole; and thermally conductive adhesive is filled in each of the first adhesive-applying hole and the second adhesive-applying holes, to secure the image sensor to the frame.

9. The camera module of claim 8, further comprising a substrate supporting the image sensor, interposed between the front cover and the frame and a through hole through which the projection enter at a position where corresponds to the center part of the image sensor.

10. The camera module of claim 8, wherein the frame has a heat-radiating surface facing away from the front cover, the first adhesive-applying hole and second adhesive-applying holes open in the heat-radiating surface, and the thermally conductive adhesive is exposed in a direction of the heat-radiating surface from the first adhesive-applying hole and second adhesive-applying holes.

* * * * *